United States Patent
Nanri et al.

(10) Patent No.: US 9,330,883 B2
(45) Date of Patent: May 3, 2016

(54) CHARGED PARTICLE BEAM DEVICE

(71) Applicant: HITACHI HIGH-TECHNOLOGIES CORPORATION, Tokyo (JP)

(72) Inventors: Terutaka Nanri, Tokyo (JP); Satoshi Tomimatsu, Tokyo (JP); Isamu Sekihara, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 14/382,165

(22) PCT Filed: Feb. 20, 2013

(86) PCT No.: PCT/JP2013/054217
§ 371 (c)(1),
(2) Date: Aug. 29, 2014

(87) PCT Pub. No.: WO2013/129209
PCT Pub. Date: Sep. 6, 2013

(65) Prior Publication Data
US 2015/0014529 A1  Jan. 15, 2015

(30) Foreign Application Priority Data
Mar. 1, 2012 (JP) ................................. 2012-045128

(51) Int. Cl.
*H01J 37/00* (2006.01)
*H01J 37/244* (2006.01)
(Continued)

(52) U.S. Cl.
CPC ............... *H01J 37/244* (2013.01); *H01J 37/28* (2013.01); *H01J 37/3056* (2013.01);
(Continued)

(58) Field of Classification Search
CPC . H01J 37/244; H01J 37/3056; H01J 37/3178; H01J 37/28; H01J 2237/244; H01J 2237/24571; H01J 2237/24495
USPC .................................. 250/306, 307, 310, 311
See application file for complete search history.

(56) References Cited

U.S. PATENT DOCUMENTS 3,103,584 A  9/1963  Shapiro et al.
4,438,332 A  3/1984  Lichtenegger
(Continued)

FOREIGN PATENT DOCUMENTS

DE  2005682 A1  9/1971
EP  1511066 A2  3/2005
(Continued)

OTHER PUBLICATIONS

German Office Action received in corresponding German Application No. 112013000852.1 dated Jun. 5, 2015.
(Continued)

*Primary Examiner* — Michael Maskell
(74) *Attorney, Agent, or Firm* — Mattingly & Malur, PC

(57) ABSTRACT

Provided is a charged particle beam device with high sensitivity, capable of detecting charged particles emitted from a sample at high resolution. An absorption current detector arranged to contact with the sample makes an absorption current generated in the sample by an irradiated charged particle beam flow through the detector, thereby to detect the current. The charged particle beam scans the sample and the charged particle beam device acquires an absorption current image. In case the absorption current detector is arranged separated from the sample, the absorption current detector detects the incident charged particle beam as a signal current dependent on an angle θ formed in a direction from the irradiation position on the sample toward the absorption current detector relative to at least one of the normal line direction of the front surface of the sample and the incident direction of the charged particle beam.

19 Claims, 13 Drawing Sheets

(51) Int. Cl.
*H01J 37/28* (2006.01)
*H01J 37/317* (2006.01)
*H01J 37/305* (2006.01)

(52) U.S. Cl.
CPC ...... *H01J 37/3178* (2013.01); *H01J 2237/244* (2013.01); *H01J 2237/24495* (2013.01); *H01J 2237/24571* (2013.01)

(56) References Cited

U.S. PATENT DOCUMENTS

| | | | |
|---|---|---|---|
| 6,452,174 B1* | 9/2002 | Hirose et al. | 850/43 |
| 2003/0080293 A1* | 5/2003 | Dan et al. | 250/310 |
| 2008/0135754 A1* | 6/2008 | Eto | 250/310 |
| 2008/0260106 A1 | 10/2008 | Davilla | |

FOREIGN PATENT DOCUMENTS

| | | |
|---|---|---|
| JP | 44-30971 Y1 | 12/1969 |
| JP | 55-143766 A | 11/1980 |
| JP | 61-088442 A | 5/1986 |
| JP | 64-37687 U | 3/1989 |
| JP | 09-326425 A | 12/1997 |
| JP | 2010-199002 A | 9/2010 |

OTHER PUBLICATIONS

Peng, L.-M., "Performing probe experiments in the SEM", Micron 35, 2004, p. 495-502.

Shiraki, I. et al., "Independently driven four-tip probes for conductivity measurements in ultrahigh vacuum", Surface Science 493, 2001, p. 633-643.

* cited by examiner

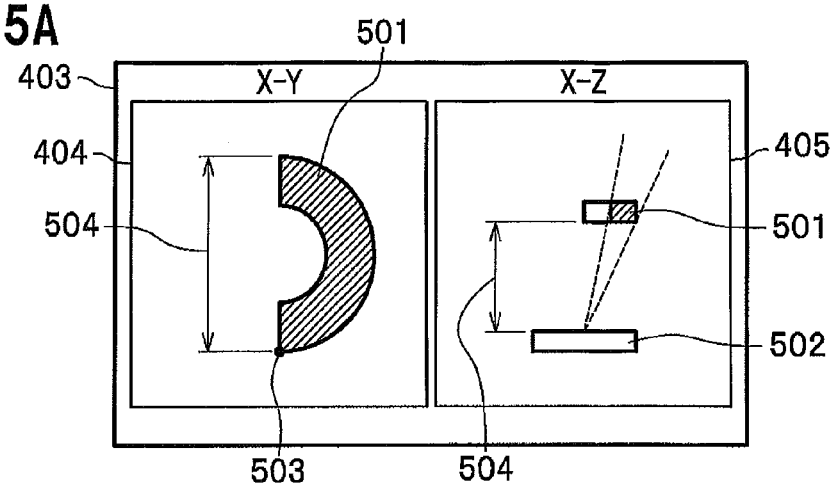
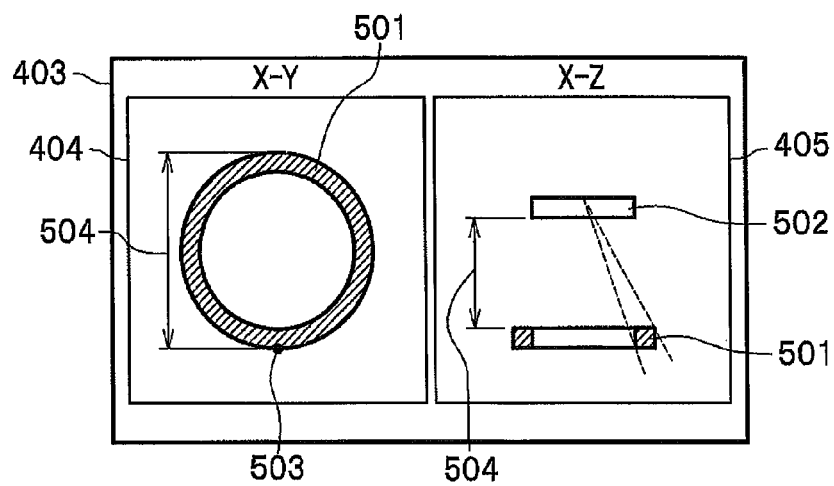
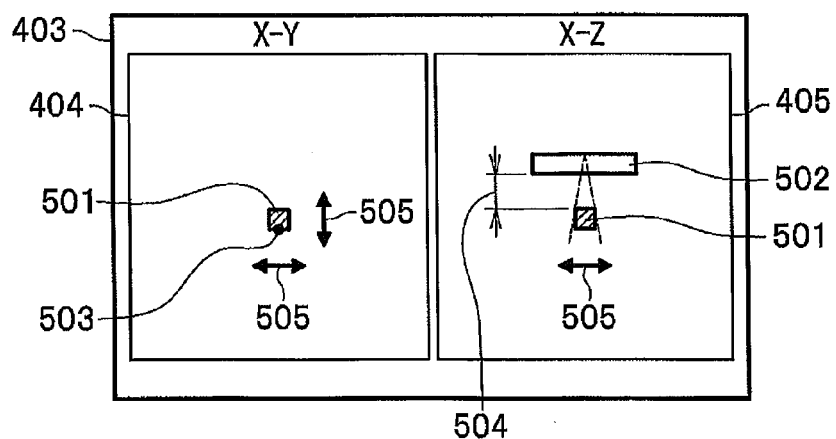

CHARGED PARTICLE BEAM DEVICE

TECHNICAL FIELD

The present invention relates to a charged particle beam device that irradiates a sample with a charged particle beam.

BACKGROUND ART

In recent years, charged particle beam devices such as a scanning electron microscope (SEM), a transmission electron microscope (TEM), a scanning transmission electron microscope (STEM), a focused ion beam (FIB) processing and observation system have been used to observe minute regions. In these devices, a sample is irradiated with a charged particle beam such as an electron beam and an ion beam. For example, when a sample is irradiated with an electron beam, secondary electrons, reflection electrons, etc., are emitted from the front surface of the sample and transmission electrons are emitted from the rear surface thereof. Herein, an emission amount of these electrons (i.e., charged particles) has angular dependence so that the emission amount thereof changes associated with an emission angle, as depending on a shape and a composition, etc., of the sample. Accordingly, a device which detects those electrons at the most suitable angle has been proposed in case an emission amount of electrons has angular dependence (see Patent Literature 1, etc.).

PRIOR ART REFERENCE

Patent Literature

Patent Literature 1: JP 2010-199002 A

SUMMARY OF THE INVENTION

Problems to be Solved by the Invention

Regarding the angular dependence, for example, reflection electrons have a large emission amount (i.e., strong signal intensity) in a specular reflection direction, while in a direction opposite to the specular reflection direction, reflection electrons in turn have a small emission amount and thereby the signal intensity is small. Therefore, based on the difference in those emission amounts, an image having different outline shades at the concave and convex parts may be acquired. The composition data of a sample is emphasized when two kinds of signal intensity, i.e., the strong signal intensity and the weak signal intensity are added together, whereas the concave and convex data of the sample are emphasized when they are subtracted one from the other. As described above, even if the emission amount (signal intensity) of the reflection electrons is acquired from the same sample, the different data is acquired depending on the emission angle, i.e., the detection angle of the reflection electrons. The same applies not only to the reflection electrons but to secondary electrons and transmission electrons and also applies not only to electrons but to charged particles containing ions.

That is, an emission amount of reflection charged particles, secondary charged particles, or transmission charged particles, etc., has the angular dependence. Accordingly, development of a device capable of detecting charged particles at the most suitable angle in case an emission amount of the charged particles has angular dependence may meet a wide range of demands of the present age.

Note a sample irradiated with a charged particle beam has a minute internal structure like, for example, a semiconductor device. Therefore, when only a local part constituting the minute structure is irradiated with a charged particle beam to detect charged particles emitted from the local part, the detection amount is small. Hereby, in order to detect the small amount of the charged particles, i.e., in order to increase sensitivity, it is desirable to arrange a detector as close to the sample as possible. This is because if charged particles fly a long distance, the charged particles are likely to be scattered and the collection efficiency of the charged particles becomes lower, even though the charged particles fly in a vacuum space.

On the other hand, charged particles flying a long distance spread each other in a space. This in turn may increase angle resolution of a detector, allowing the charged particles to be easily collected by the detector at a desired angle. Thus, if a detector is arranged closer to the sample, this arrangement in turn requires increase in the angle resolution of the detector.

Patent Literature 1 describes that a detector is arranged closer to away from a sample to detect electrons of which emission amount has angular dependence at a most-suitable angle. However, the literature does not describe any of a device capable of increasing angle resolution of a detector even if the detector is arranged close to the sample.

Accordingly, an object of the present invention is to provide a charged particle beam device having high sensitivity, which is capable of detecting charged particles emitted from a sample at a specific emission angle in a highly resolutional manner.

Means for Solving the Problem

The present invention provides a charged particle beam device comprising a charged particle beam irradiation unit that irradiates a sample with a charged particle beam, and an absorption current detector that detects an adsorption current generated in the sample by the irradiated charged particle beam. Herein, the absorption current detector detects the adsorption current thus generated in the sample and flowing through the detector, if the detector is arranged to contact with the sample.

The charged particle beam device scans the sample with the charged particle beam to acquire an absorption current image. Specifically, when the absorption current detector is arranged separated from the sample, the absorption current detector detects, as the charged particle beam emitted from the sample by the irradiation of the charged particle beam is incident on the absorption current detector, the incident charged particle beam as a signal current dependent on an angle formed in a direction from an irradiation position of the charged particle beam on the sample toward the absorption current detector relative to at least one of a normal line direction of a front surface of the sample and an incident direction of the charged particle beam.

Effect of the Invention

According to the present invention, it is possible to provide a charged particle beam device having high sensitivity and capable of detecting charged particles emitted from a sample at a specific emission angle in a highly resolutional manner.

BRIEF DESCRIPTION OF THE DRAWINGS

FIG. 5A shows a (first) detector status indication inside the GUI screen;

FIG. 5B shows a (second) detector status indication inside the GUI screen;

FIG. 5C shows a (third) detector status indication inside the GUI screen;

EMBODIMENT FOR CARRYING OUT THE INVENTION

Figure 1:
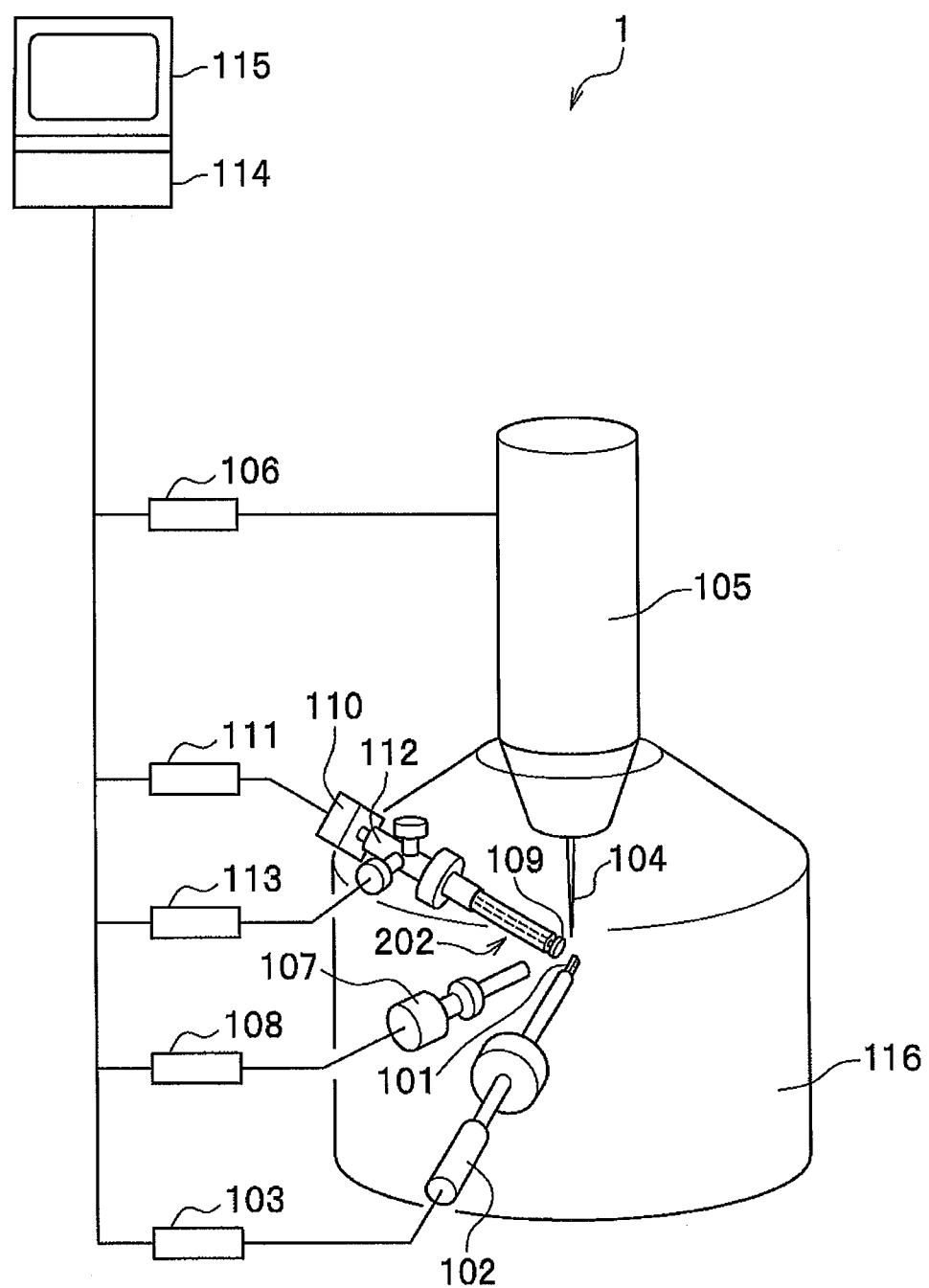
FIG. 1 is a configuration view of a charged particle beam device according to a first embodiment of the present invention.

Next, embodiments of the present invention will be described in detail by appropriately referring to the drawings. Note that in each of figures, the same components are denoted by the same symbols to omit their duplicated descriptions.

(First Embodiment)

FIG. 1 shows a configuration view of a charged particle beam device 1 according to a first embodiment of the present invention. Note that although the first embodiment exemplifies an SEM, i.e., an electron beam device as the charged particle beam device 1, the present invention can also be applied to other charged particle beam devices (charged particle beam microscopes) 1.

The charged particle beam device 1 has: a sample stage 102 that has a sample 101 placed thereon and causes the same to move, a sample position control unit 103 that controls the movement, etc., of the sample stage 102; an electron beam optical system unit 105 that irradiates the sample 101 with an electron beam (charged particle beam) 104 for scanning; an electron beam optical system control unit 106 that controls the electron beam optical system unit 105; a secondary electron detector 107 that detects secondary electrons, etc., generated from the sample 101; a secondary electron detector control unit 108 that controls the secondary electron detector 107; a conductive member 109; an absorption current detector 110 that has the conductive member 109 detachably mounted on the tip end thereof and detects an absorption current; an absorption current detector control unit 111 that controls the detection of the absorption current detector 110; an absorption current detector stage 112 that has the absorption current detector 110 placed thereon and causes the same to move; an absorption current detector position control unit 113 that controls the movement of the absorption current detector stage 112; a central processing unit (computer) 114 that controls each of the equipment described above; a display unit 115 that has a display to display an SEM image, an absorption current image, etc., and an operation screen, etc.; and a vacuum container 116 that accommodates the sample 101, the conductive member 109, etc., and keeps the same under a vacuum atmosphere.

The sample position control unit 103, the electron beam optical system control unit 106, the secondary electron detector control unit 108, the absorption current detector control unit 111, and the absorption current detector position control unit 113, etc., are controlled by the central processing unit 114. As the central processing unit 114, a personal computer, a workstation, etc., can be, for example, used. The sample stage 102, the electron beam optical system unit 105, the secondary electron detector 107, the absorption current detector 110, and the absorption current detector stage 112 are arranged in the vacuum container 116.

According to the above configuration, the sample 101 is irradiated with the electron beam 104, and secondary electrons, etc., of which emission amount has angular dependence among the secondary electrons, etc., emitted from the sample 101 are taken by the conductive member 109 to generate a signal current. The absorption current detector 110 detects the signal current as an absorption current and acquires a signal current image as is the case with an absorption current image. The conductive member 109 is mounted on a cable-like tip end 202 of the absorption current detector 110. Thus, the conductive member 109 can be arranged near the sample 101, and even a slight amount of the secondary electrons emitted from the sample 101 can be reliably taken. In addition, by changing the direction of the conductive member 109 relative to the sample 101, the angular dependence of the secondary electrons, etc., can be easily evaluated. Further, if the conductive member 109 is arranged in a specific direction providing angular dependence relative to the sample 101, the signal current described above can be acquired. A signal current image can be acquired when the signal current described above is acquired while the electron beam 104 for the irradiation of the sample 101 is scanned.

Note that the secondary electrons, etc., emitted from the sample 101 can also be detected by the secondary electron detector 107. An SEM image can be acquired when the secondary electrons, etc., are detected by the secondary electron detector 107 while the electron beam 104 for the irradiation of the sample 101 is scanned.

Figure 2A:
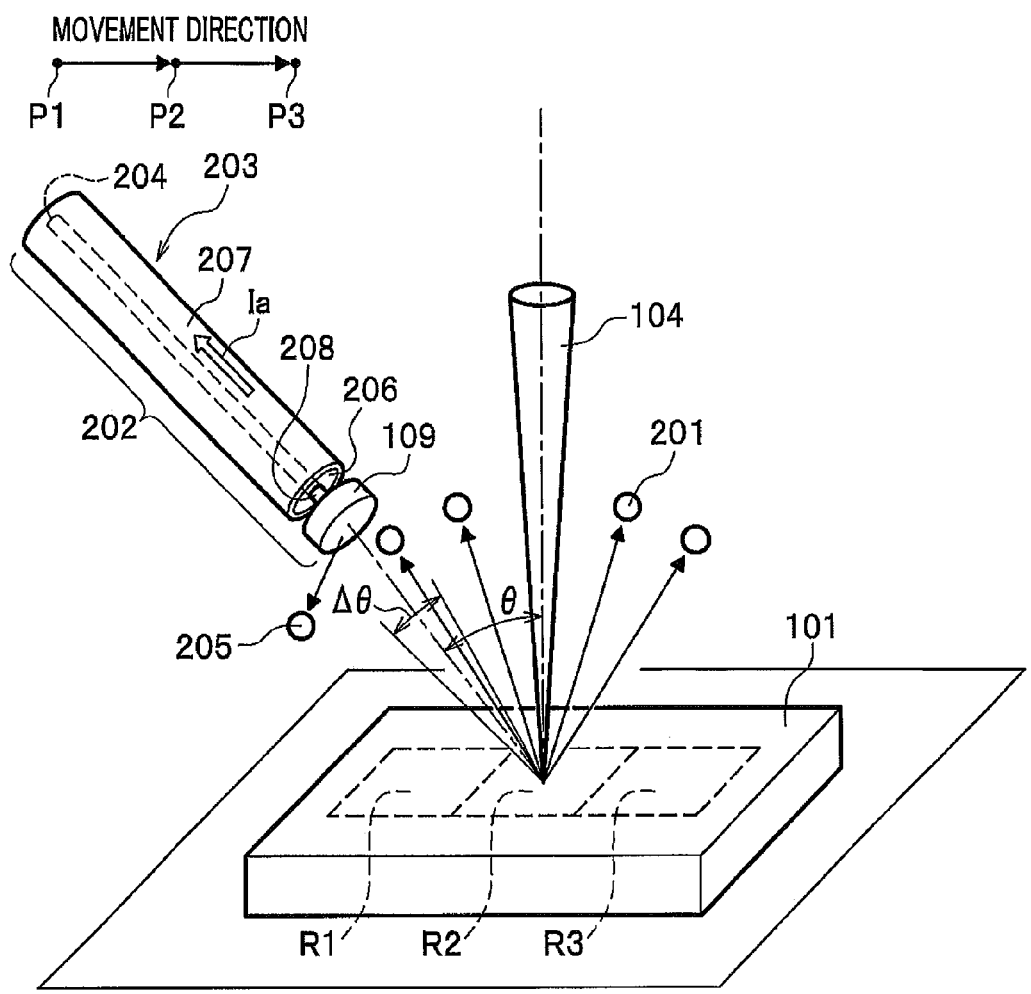
FIG. 2A is a schematic view showing a (first) method for detecting charged particles of which emission amount has angular dependence with the tip end of an absorption current detector in the charged particle beam device according to the first embodiment of the present invention.

FIG. 2A shows a (first) method for detecting secondary charged particles (secondary electrons) 201 of which emission amount has angular dependence with the tip end 202 of the absorption current detector 110 in the charged particle beam device 1 according to the first embodiment of the present invention. Note that the secondary charged particles (secondary electrons) include secondary charged particles (reflection electrons). When the sample 101 is irradiated with the electron beam 104, the secondary electrons 201 are emitted from the sample 101.

When the emitted secondary electrons 201 collide with the conductive member 109 on the tip end 202 of the absorption current detector 110, a signal current Ia flows from the conductive member 109 to a signal line 204 connected to the conductive member 109. Note that all the secondary electrons 201 colliding with the conductive member 109 are not necessarily converted into the signal current Ia but the difference between the secondary electrons 201 colliding with the conductive member 109 and tertiary charged particles (tertiary electrons) 205 emitted from the conductive member 109 is turned into the signal current Ia. With the detection of the signal current Ia, it becomes possible to acquire a signal current image reflecting the sample data of the secondary electrons 201. Note that although the signal current Ia is extremely weak, imaging can be achieved, for example, by increasing the current amount of the electron beam 104 or by increasing the signal amplification ratio of the absorption current detector 110, etc.

The conductive member 109 is arranged such that an angle θ formed in a direction from the irradiation position of the electron beam 104 on the sample 101 toward the conductive member 109 relative to the normal line direction of the front surface of the sample or the incident direction of the electron beam 104 agrees with a specific angle at which the secondary electrons 201 of which emission amount has angular dependence are emitted.

In addition, the conductive member 109 is arranged such that a range Δθ of the angle at which the conductive member 109 is seen from the irradiation position of the electron beam 104 on the sample 101 agrees with the specific angle range at which the secondary electrons 201 of which emission amount has angular dependence are emitted.

The tip end 202 of the absorption current detector 110 has a coaxial cable 203, a contact probe 208 connected to the coaxial cable 203, and the conductive member (non-contact probe) 109 connected to the contact probe 208. The coaxial cable 203 has the signal line 204 through which the signal current Ia flows, a shield 207 that covers the signal line 204 and is grounded, and an insulation material 206 that insulates the signal line 204 from the shield 207. The contact probe 208 protrudes from the end of the coaxial cable 203. The contact probe 208 is connected to and supported by the signal line 204. As will be described later, the contact probe 208 is used as a probe that is brought into contact with and is electrically connected to the sample 101.

The conductive member 109 is connected to and supported by the contact probe 208. As shown in FIG. 2A, the conductive member 109 is used as a non-contact probe that is not brought into contact with the sample 101. In this way, only the secondary electrons 201 colliding with the conductive member 109 can be turned into the signal current Ia. Since the shield 207 is grounded, the secondary electrons 201 colliding with the shield 207 flow to the ground, whereby the occurrence of a charge up can be prevented. Note that if the secondary electrons 201 colliding with the conductive member 109 are extremely greater in amount than the secondary electrons 201 colliding with the shield 207, the shield 207 and the insulation material 206 can be omitted.

The conductive member 109 is connected to the tip of the contact probe 208 and capable of being attached to and detached from the contact probe 208. In addition, if the contact probe 208 may also have the function of the conductive member 109, the conductive member 109 may be omitted. If the conductive member 109 is directly connected to the sample 10 without being detached from the contact probe 208, the conductive member 109 may also have the function of the contact probe 208. That is, the contact probe 208 that detects an absorption current may be used as the conductive member (non-contact probe) 109 to detect the signal current Ia. In addition, a probe that extracts a micro sample may be used as the conductive member (non-contact probe) 109 or the contact probe 208 in micro sampling™.

Note that although the conductive member 109 is formed in a disc shape in FIG. 2A, the shape of the conductive member 109 is not limited to it. By changing the shape, size, etc., of the conductive member 109, detection sensitivity and a detection region can be changed. A method for changing the size and shape of the conductive member 109 includes a method for replacing the conductive member 109 with another member having a different size and shape as will be described later, a method for rotating or reciprocating the conductive member 109 together with the tip end 202 of the absorption current detector 110, etc.

The material of the conductive member 109 is desirably a light element that emits a small amount of secondary electrons or contains the light element. Specifically, the composition of the material of the conductive member 109 is desirably an element having a smaller atomic number than copper or contains the element. The composition can reduce the emission of the tertiary electrons 205 and increase the signal current Ia.

In addition, the function of applying a voltage to the conductive member 109 may be provided. For example, when a positive voltage is applied to the conductive member 109, the conductive member 109 can attract secondary electrons, reflection electrons, tertiary electrons, etc., and increase the signal current Ia. In addition, when a voltage of about −50 V is applied to the conductive member 109, the conductive member 109 can reject secondary electrons and acquire only reflection electrons.

Note that if the sample 101 is large in size, the angle θ described above is deviated from the specific angle, at which the secondary electrons 201 of which emission amount has angular dependence are emitted, when the irradiation position on the sample is moved by the scanning of the electron beam 104. Accordingly, first, with the unit image acquisition system of the central processing unit 114, a region R2 on the sample 101 satisfying the condition that the angle θ substantially equals the specific angle is scanned by the electron beam 104 to acquire a unit image according to the signal current Ia. Next, as the scanning region is moved from the region R2 to a region R3 by the sample stage 102, the detector movement system of the central processing unit 114 moves the tip end 202 (conductive member 109) of the absorption current detector from a position P2 to a position P3 satisfying the condition described above.

The acquisition of a unit image and the movement of the tip end 202 (conductive member 109) of the absorption current detector described above are repeatedly performed. Thus, a plurality of unit images such as a unit image corresponding to a region R1 and a position P1, a unit image corresponding to the region R2 and the position P2, and a unit image corresponding to the region R3 and the position P3 can be acquired. By combining a plurality of acquired unit images together, the central processing unit 114 can acquire a signal current image.

Figure 2B:
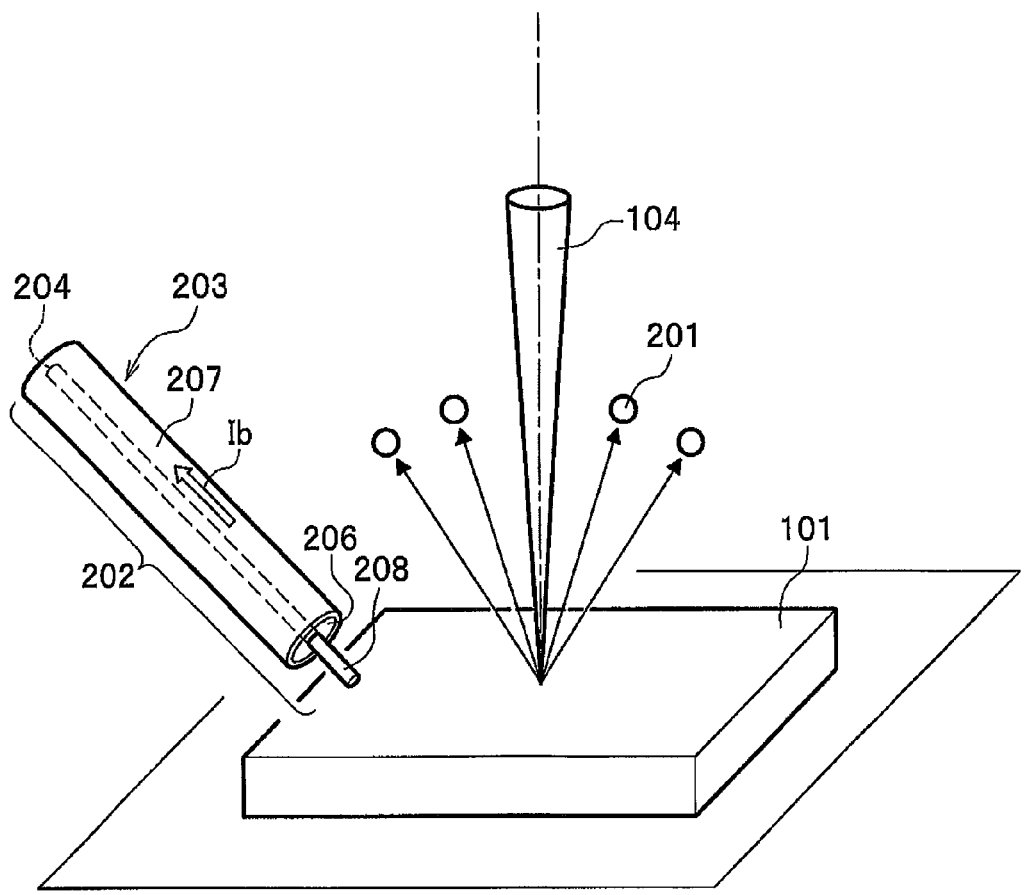
FIG. 2B is a schematic view showing a method for detecting an absorption current from a sample with the tip end of the absorption current detector in the charged particle beam device according to the first embodiment of the present invention.

FIG. 2B shows a method for detecting an absorption current Ib from the sample 101 with the tip end 202 of the absorption current detector in the charged particle beam device according to the first embodiment of the present invention. The conductive member 109 is removed from the contact probe 208. In addition, the contact probe 208 is brought into contact with the sample 101. When the sample 101 is irradiated with the electron beam 104, the absorption current Ib as well as the secondary electrons 201 is generated in the sample 101. The absorption current Ib flows into the contact probe 208 and is detected by the absorption current detector 110 (see FIG. 1). Further, an absorption current image can be acquired when the electron beam 104 scans the sample 101.

Figure 2C:
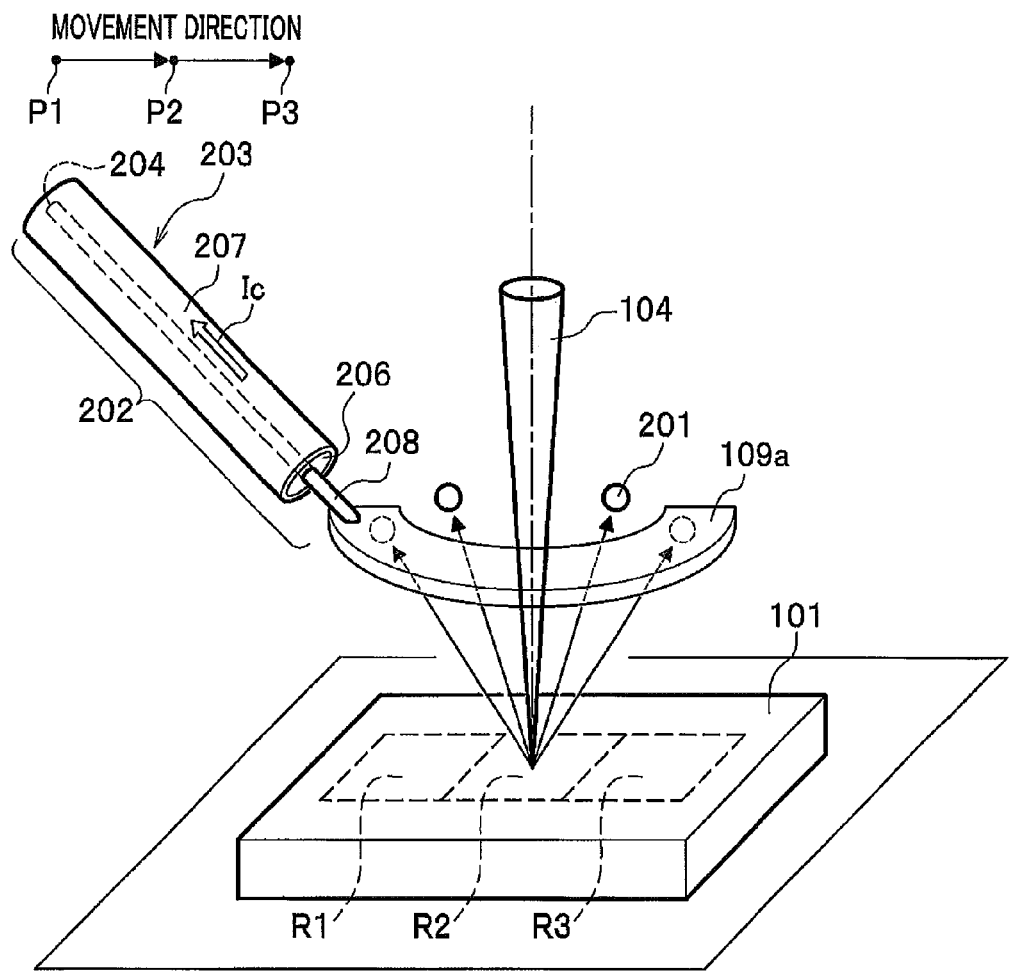
FIG. 2C is a schematic view showing a (second) method for detecting charged particles of which emission amount has angular dependence with the tip end of the absorption current detector in the charged particle beam device according to the first embodiment of the present invention.

FIG. 2C shows a (second) method for detecting charged particles of which emission amount has angular dependence with the tip end 202 of the absorption current detector in the charged particle beam device according to the first embodiment of the present invention.

The contact probe 208 has a conductive member (probe for reflection electrons) 109a(109) mounted on the tip thereof. The conductive member 109a is formed in a substantially horseshoe shape. In a planar view, the outer circumference of the conductive member 109a is formed in a semi-circular shape, and the inner circumference thereof is also formed in a semi-circular shape concentric with the semi-circular shape of the outer circumference.

When the sample 101 is irradiated with the electron beam 104, the secondary electrons 201 of which emission amount has the angular dependence of the same properties are emitted together with reflection electrons along the cone-like side surface of a downward convexity whose apex is located at an irradiation position on the sample 101. Accordingly, if the conductive member 109a is arranged along the circumferential direction of the cone, the yield of the secondary electrons 201 can be increased. Further, if the conductive member 109a is arranged closer to the sample 101, the secondary electrons 201, each of which forms a greater angle in the emitted direction thereof relative to the direction of the electron beam, can be taken.

On the other hand, if the conductive member 109a is arranged separated from the sample 101, the secondary electrons 201, each of which forms a smaller angle in the emitted direction thereof relative to the direction of the electron beam, can be taken. In addition, besides being evenly emitted in the circumferential direction of the cone, the emission amount of the secondary electrons 201 may have angular dependence in the circumferential direction. Since the conductive member 109a is arranged by 180° half the entire circumferential angle 360° in the circumferential direction, the secondary electrons 201 of which emission amount has angular dependence in the circumferential direction can also be detected. In addition, although the conductive member 109a is arranged on the same side as the electron beam 104 relative to the sample 101, the outer circumference and the inner circumference are formed in the semi-circular shapes in the planar view of the conductive member 109a. Therefore, the electron beam 104 can be easily taken in or taken out the conductive member 109a without intersecting the conductive member 109 to perform scanning.

Figure 2D:
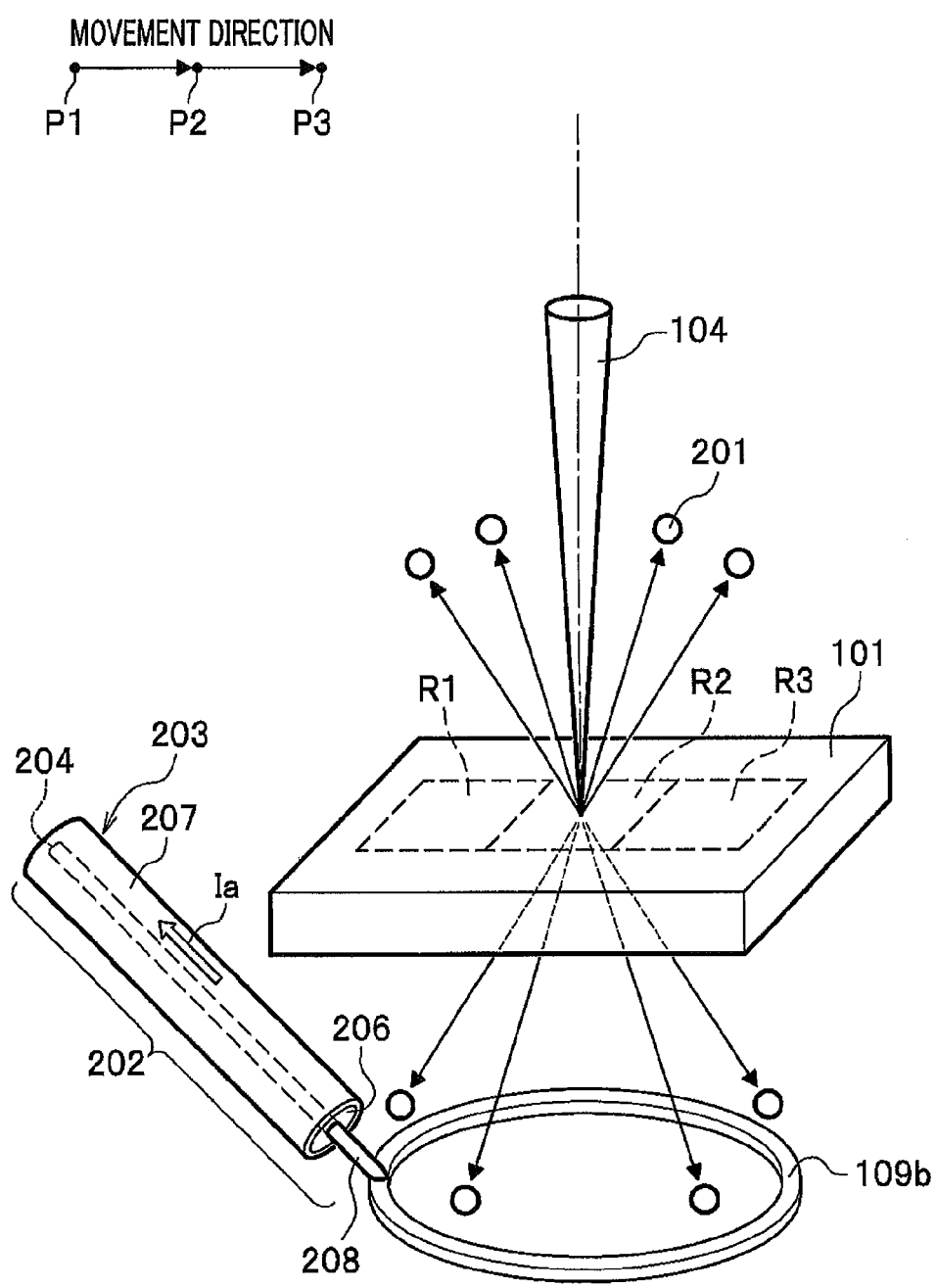
FIG. 2D is a schematic view showing a (third) method for detecting charged particles of which emission amount has angular dependence with the tip end of the absorption current detector in the charged particle beam device according to the first embodiment of the present invention.

FIG. 2D shows a (third) method for detecting charged particles of which emission amount has angular dependence with the tip end 202 of the absorption current detector in the charged particle beam device according to the first embodiment of the present invention. The contact probe 208 has a conductive member (probe for transmission electrons) 109b (109) mounted on the tip thereof. The conductive member 109b is formed in a ring shape. In a planar view, the outer circumference of the conductive member 109b is formed in a circular shape, and the inner circumference thereof is also formed in a circular shape concentric with the circular shape of the outer circumference. When the sample 101 is irradiated with the electron beam 104, the secondary electrons 201 pass through the sample 101 like transmission electrons besides being reflected like reflection electrons. Further, the secondary electrons 201 of which emission amount has the angular dependence of the same properties among the transmission electrons are emitted along the cone-like side surface of an upward convexity whose apex is located at an irradiation position on the sample 101. Accordingly, if the conductive member 109b is arranged along the circumferential direction of the cone, the yield of the secondary electrons (transmission electrons) 201 can be increased. Further, if the conductive member 109b is arranged closer to the sample 101, the secondary electrons 201, each of which forms a greater angle in the emitted direction thereof relative to the direction of the electron beam, can be taken.

On the other hand, if the conductive member 109b is arranged separated from the sample 101, the secondary electrons 201, each of which forms a smaller angle in the emitted direction thereof relative to the direction of the electron beam, can be taken. Note that the conductive member 109b is arranged on a side opposite to the electron beam 104 relative to the sample 101.

Figure 2E:
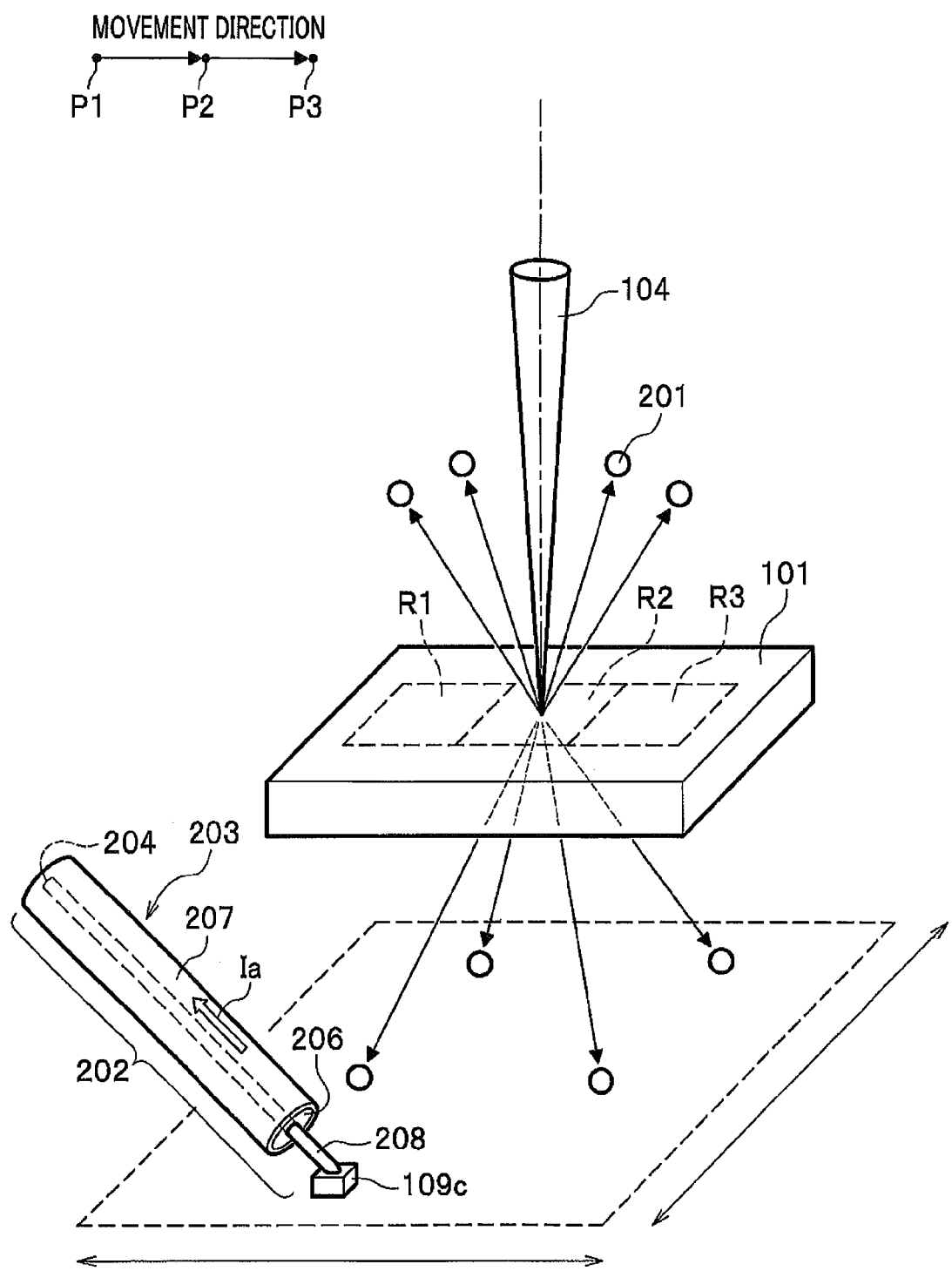
FIG. 2E is a schematic view showing a (fourth) method for detecting charged particles of which emission amount has angular dependence with the tip end of the absorption current detector in the charged particle beam device according to the first embodiment of the present invention.

FIG. 2E shows a (fourth) method for detecting charged particles of which emission amount has angular dependence with the tip end 202 of the absorption current detector in the charged particle beam device according to the first embodiment of the present invention. The contact probe 208 has a conductive member (probe for a diffraction pattern) 109c (109) mounted on the tip thereof. The conductive member 109c is formed in a rectangular shape. In a planar view, the conductive member 109c is formed in a square shape. By the conductive member 109c, a diffraction pattern significant in recognizing a crystal orientation can be acquired. The conductive member 109c is arranged on a side opposite to the electron beam 104 relative to the sample 101. The square shape of the conductive member 109c is made into a pixel at each position of the diffraction pattern. The conductive member 109c is moved to scan a plane at which the diffraction pattern is generated, while the secondary electron (transmission electron) 201 is acquired for each position as the pixel of each position on the plane. The acquired secondary electron (transmission electron) 201 is detected for each position as the signal current Ia.

As described above, the probe can be changed for different purposes in such a way that the contact probe 208 of FIG. 2B is used or the conductive member (probe for reflection electrons) 109a of FIG. 2C, the conductive member (probe for transmission electrons) 109b of FIG. 2D, or the conductive member (probe for a diffraction pattern) 109c of FIG. 2E is mounted on the contact probe 208 instead of the conductive member 109.

Figure 3:
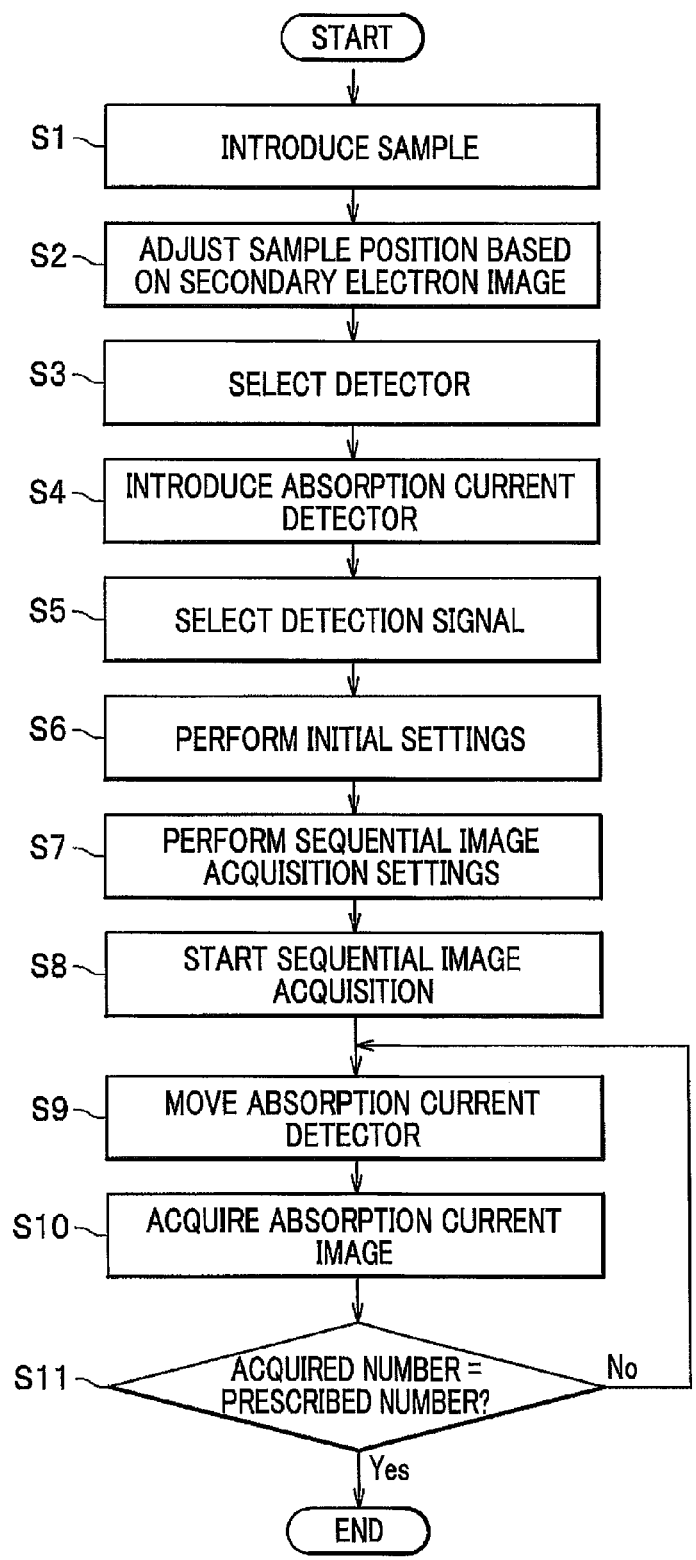
FIG. 3 is a flowchart of a method for generating an image of charged particles of which emission amount has angular dependence with the charged particle beam device according to the first embodiment of the present invention.

FIG. 3 shows the flowchart of a method for generating an image of charged particles of which emission amount has angular dependence with the charged particle beam device according to the first embodiment of the present invention. Based on this, a signal current image can be sequentially acquired at a plurality of positions registered in advance. First, in step S 1, an operator places the sample 101 on the sample stage 102 extracted from the vacuum container 116. The central processing unit 114 introduces the sample stage 102 having the sample 101 placed thereon into the vacuum container 116 via the sample position control unit 103.

Next, in step S2, the central processing unit 114 controls the electron beam optical system unit via the electron beam optical system control unit to scan and irradiate the circumference of the sample 101 with the electron beam 104 and controls the secondary electron detector 107 via the secondary electron detector control unit 108 to detect secondary electrons emitted from the circumference of the sample 101 and display an SEM image on the display unit 115. While confirming the SEM image, the operator controls the sample stage 102 and adjusts the position of the sample 101 from the central processing unit 114.

Figure 4:
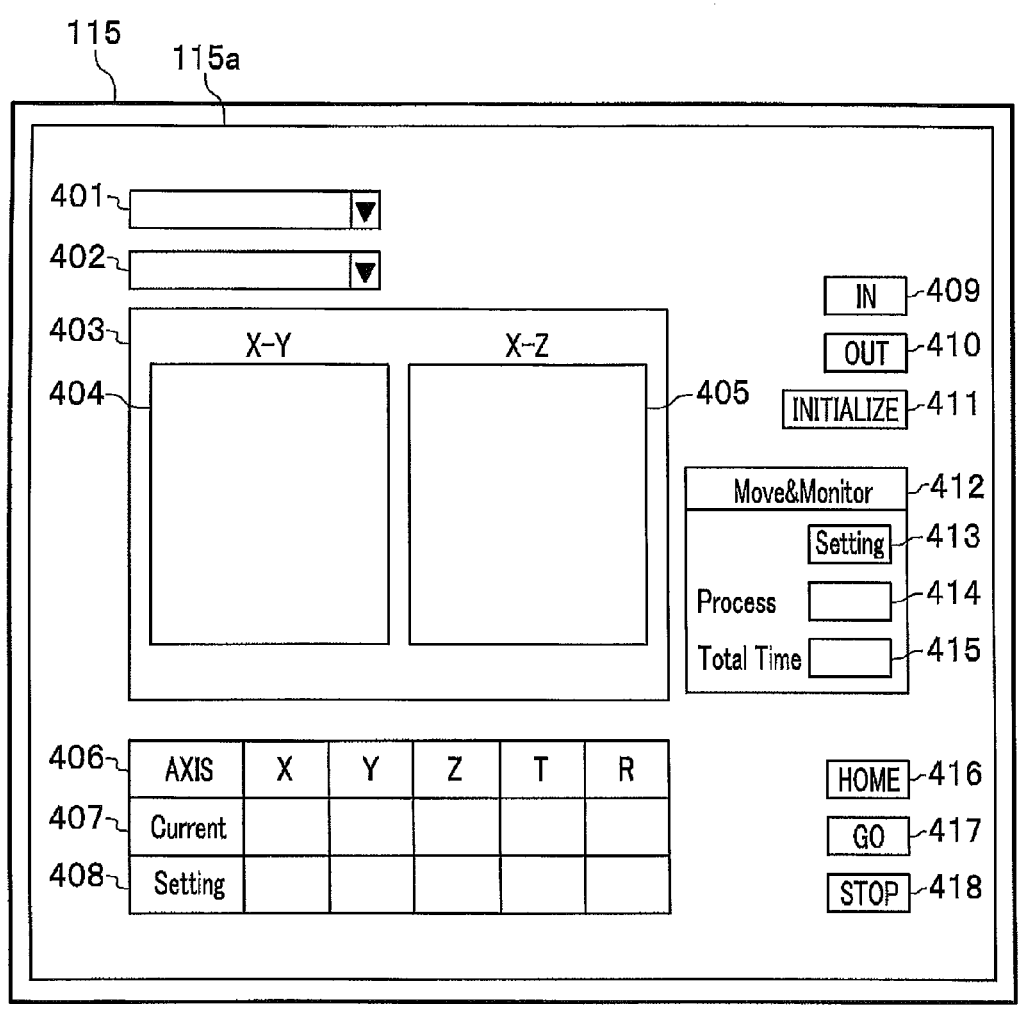
FIG. 4 shows a GUI screen (first window, homepage) displayed on the display unit of the charged particle beam device according to the first embodiment of the present invention.

FIG. 4 shows a GUI screen (first window, homepage) 115a displayed on the display unit 115. In step S3 of FIG. 3, the central processing unit 114 causes the display unit 115 to display the GUI screen (first window, homepage) 115a. The operator instructs the central processing unit 114 to switch a using detector from the secondary electron detector 107 to the absorption current detector 110 with a detector selection pull-down menu 401, and the central processing unit 114 switches to the using detector according to the instruction.

Next, in step S4, the central processing unit 114 controls the electron beam optical system unit via the electron beam optical system control unit to scan and irradiate the circumference of the sample 101 and the tip end 202 of the absorption current detector with the electron beam 104 and controls the secondary electron detector 107 via the secondary electron detector control unit 108 to detect secondary electrons emitted from the circumference of the sample 101 and the tip end 202 of the absorption current detector and display an SEM image on the display unit 115.

When the operator clicks a detector introduction button indication 409 of FIG. 4 while confirming the SEM image, the central processing unit 114 controls the sample stage 102 to adjust the position of the sample 101 and controls the absorption current detector stage 112 to adjust the position of the conductive member 109 (contact probe 208) to introduce the conductive member 109 (contact probe 208 and absorption current detector 110) into the view of the SEM image. In addition, when the operator clicks a detector withdrawal button 410 of FIG. 4, the central processing unit 114 withdraws the conductive member 109 (contact probe 208 and absorption current detector) outside the view of the SEM image.

In step S5, the central processing unit 114 causes the display unit 115 to display the GUI screen (first window, homepage) 115a shown in FIG. 4. The operator selects the type of an angular dependence signal to be detected by the absorption current detector 110 with a detection signal (probe) selection pull-down menu 402. That is, the operator selects a using probe from among the contact probe 208, the probe 109a for reflection electrons, the probe 109b for transmission electrons, and the probe 109c for a diffraction pattern. The operator instructs the central processing unit 114 to switch to the using probe, and the central processing unit 114 switches to the using probe according to the instruction.

Next, in step S6, the operator clicks a detector initial setting button indication 411 of FIG. 4 to perform initial settings. By the clicking operation, the central processing unit 114 performs, for example, the measurement of the shapes of the conductive member 109 and the sample 101, the adjustment of a mutual positional relationship, a detection region, the avoidance of the interference between the conductive member 109 and the sample 101, etc. The central processing apparatus 114 controls the electron beam optical system unit 105 via the electron beam optical system control unit 106 to scan and irradiate the circumference of the conductive member 109 and the sample 101 with the electron beam 104 and controls the secondary electron detector 107 via the secondary electron detector control unit 108 to detect secondary electrons emitted from the circumference of the conductive member 109 and the sample 101 and acquire the SEM image of the conductive member 109 and the sample 101.

The results of measuring the shapes and adjusting a detection region and the positional relationship between the conductive member 109 and the sample 101 are displayed on an X-Y plane indication 404 and an X-Z plane indication 405 of a detector status indication 403 of FIG. 4. Based on the indications, the operator can adjust the positions of the conductive member 109 and the sample 101 via the central processing unit 114. The positional relationship between the conductive member 109 and the sample 101 is set such that the conductive member 109 and the sample 101 do not interfere with each other and secondary electrons of which emission amount has angular dependence are incident on the conductive member 109.

Note that for the measurement of the shape of the conductive member 109, an absorption current image, which is acquired by scanning and irradiating the conductive member 109 and its circumference with the electron beam 104 and detecting an absorption current generated by the irradiation from the conductive member 109 with the absorption current detector 110, may be used instead of the SEM image described above. In this way, an image that does not reflect the sample 101, etc., but reflects only the shape of the conductive member 109 can be acquired, which in turn improves measurement accuracy. In addition, for the measurement of the shape of the sample 101, a signal current image, which is acquired by scanning and irradiating the sample 101 and its circumference with the electron beam 104, acquiring secondary electrons emitted by the irradiation from the sample 101 with the conductive member 109 to generate a signal current, and detecting the signal current with the absorption current detector 110, may be used instead of the SEM image described above.

The adjustment of avoiding the interference with the sample 101 includes, for example, a method for once bringing the conductive member 109 into contact with the sample 101 to register a mutual position, a method for rotating the conductive member 109 to capture an image from the side surface and measuring and registering the distance between the conductive member and the sample 101 based on the image, etc.

FIG. 5A shows a (first) example of the detector status indication 403 inside the GUI screen at initial settings. The X-Y plane indication 404 of the detector status indication 403 indicates an image 501 of the conductive member (probe for reflection electrons) 109a projected on an X-Y plane. A position 503 at which the conductive member (probe for reflection electron) 109a is supported by the contact probe 208 is indicated. In addition, the size or the like of the diameter of the semi-circle such as the outer circumference of the conductive member (probe for reflection electrons) 109a is measured and indicated by a size indication 504. By these indications, the operator can easily identify a detection region at which the detection of reflection electrons is allowed.

The X-Z plane indication 405 of the detector status indication 403 indicates the image 501 of the conductive member (probe for reflection electrons) 109a projected on an X-Z plane and an image 502 of the sample 101 projected on the X-Z plane. In addition, the size or the like of the distance between the conductive member (probe for reflection electrons) 109a and the sample 101 is measured and indicated by a size indication 504. By these indications, the operator can easily identify that the conductive member (probe for reflection electrons) 109a is arranged over the sample 101. In addition, the operator can easily identify a direction from (the irradiation position of the electron beam 104) over the sample 101 to the conductive member (probe for reflection electrons) 109a.

FIG. 5B shows a (second) example of the detector status indication 403 inside the GUI screen at initial settings. The X-Y plane indication 404 of the detector status indication 403 indicates an image 501 of the conductive member (probe for transmission electrons) 109b projected on the X-Y plane. A position 503 at which the conductive member (probe for transmission electrons) 109b is supported by the contact probe 208 is indicated. In addition, the size or the like of the diameter of the circle such as the outer circumference of the conductive member (probe for transmission electrons) 109b is measured and indicated by a size indication 504. By these indications, the operator can easily identify a detection region at which the detection of transmission electrons is allowed. The X-Z plane indication 405 of the detector status indication 403 indicates the image 501 of the conductive member (probe for transmission electrons) 109b projected on the X-Z plane and an image 502 of the sample 101 projected on the X-Z plane. In addition, the size or the like of the distance between the conductive member (probe for transmission electrons) 109b and the sample 101 is measured and indicated by a size indication 504. By these indications, the operator can easily identify that the conductive member (probe for transmission electrons) 109b is arranged under the sample 101. In addition, the operator can easily identify a direction from (the irradiation position of the electron beam 104) over the sample 101 to the conductive member (probe for transmission electrons) 109b.

FIG. 5C shows a (third) example of the detector status indication 403 inside the GUI screen at initial settings. The X-Y plane indication 404 of the detector status indication 403 indicates an image 501 of the conductive member (probe for a diffraction pattern) 109c projected on the X-Y plane. A position 503 at which the conductive member (probe for a diffraction pattern) 109c is supported by the contact probe 208 is indicated. In addition, a scanning direction (range) indication 505 of the conductive member (probe for a diffraction pattern) 109c is indicated. By these indications, the operator can easily identify a detection region at which the detection of transmission electrons is allowed. The X-Z plane indication 405 of the detector status indication 403 indicates the image 501 of the conductive member (probe for a diffraction pattern) 109c projected on the X-Z plane and an image 502 of the sample 101 projected on the X-Z plane. In addition, the size or the like of the distance between the conductive member (probe for a diffraction pattern) 109c and the sample 101 is measured and indicated by a size indication 504. By these indications, the operator can easily identify that the conductive member (probe for a diffraction pattern) 109c is arranged under the sample 101. In addition, the operator can easily identify a direction from (the irradiation position of the electron beam 104) over the sample 101 to the conductive member (probe for a diffraction pattern) 109c.

Next, in step S7 of FIG. 3, the operator clicks a sequential acquisition setting button indication 413 of a sequential acquisition indication 412 of FIG. 4 to perform sequential image acquisition settings. By the clicking operation, the central processing unit 114 registers the coordinates of the driving position of the conductive member 109 and sets up the acquisition number and the observation conditions of a signal current image. Note that steps S6 and S7 can be omitted if previously-set conditions are used.

Figure 6A:
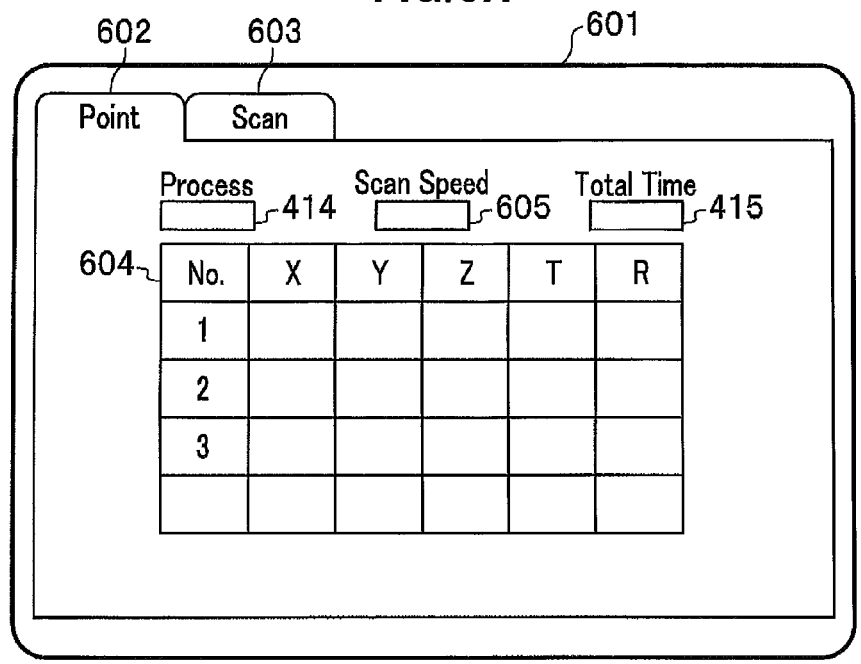
FIG. 6A shows a GUI screen ((first) sequential acquisition setting screen) displayed on the display unit of the charged particle beam device according to the first embodiment of the present invention.

FIG. 6A shows a GUI screen (sequential acquisition setting screen (first: coordinate position setting mode 602)) 601 displayed on the display unit 115 when the sequential acquisition setting button indication 413 of FIG. 4 is clicked at sequential image acquisition settings. In the coordinate position setting mode 602, a plurality of positions at the observation of the conductive member 109, specifically, a plurality of moving destinations of the position 503 (see FIG. 5A, etc.) is set (registered) in a coordinate registration table indication 604. Note that the positions may be set with XYZ coordinates or may be set with T (angle) and R (distance).

A process number indication 414 indicates the number of positions registered in the coordinate registration table indication 604. In an image acquisition time setting indication 605, an acquisition time per one sheet (one area) can be set. The longer the acquisition time, the clearer image quality becomes. A total time is determined by the product of an image acquisition time indicated by the image acquisition time setting indication 605 and the number of processes indicated by the process number indication 414 and is indicated by a total time indication 415.

Figure 6B:
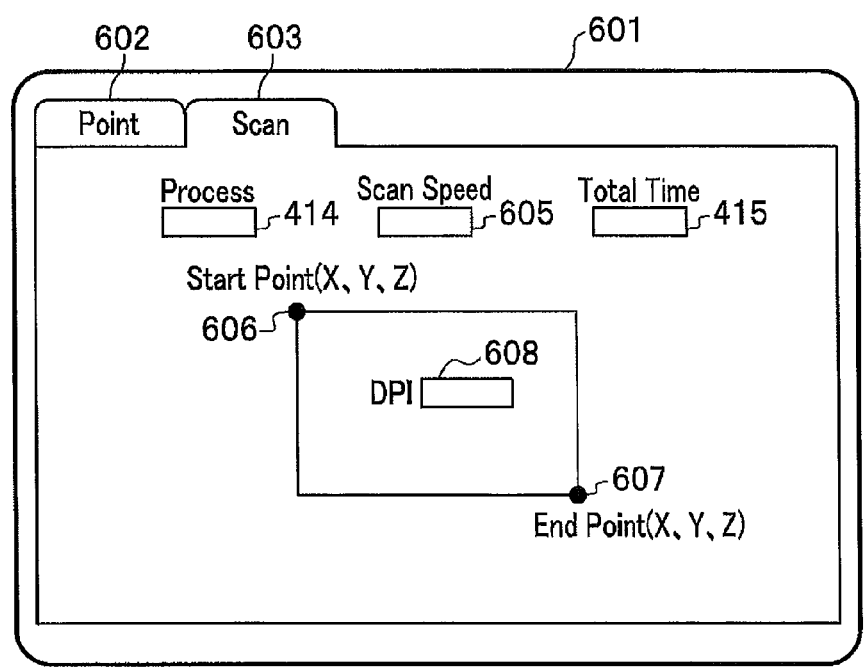
FIG. 6B shows a GUI screen ((second) sequential acquisition setting screen) displayed on the display unit of the charged particle beam device according to the first embodiment of the present invention.

FIG. 6B shows a GUI screen (sequential acquisition setting screen (second: moving region setting mode 603)) 601 displayed on the display unit 115 when the sequential acquisition setting button indication 413 of FIG. 4 is clicked at sequential image acquisition settings. In a moving region setting mode 603, the scanning range of the electron beam 104 is determined by setting a start coordinate position setting indication 606, an end coordinate position setting indication 607, and a pixel number setting indication 608. By the setting, an image acquisition time indicated by an image acquisition time setting indication 605 and a total time indicated by a total time indication 415 are changed. While seeing the total time indication 415, etc., the operator can change the number of pixels, etc., indicated by the pixel number setting indication 608.

Next, in step S8 of FIG. 3, the operator clicks a moving button 417 of FIG. 4 to start sequential image acquisition. Note that the sequential image acquisition can be stopped when a stop button 418 is clicked. In addition, the conductive member 109 and the sample 101 can be moved to the position initially set in step S6 when a home position button 416 is clicked.

Next, in step S9, the central processing unit 114 moves the conductive member 109 (absorption current detector 110) to the coordinate position (registered coordinates) registered in step S7. A current coordinate indication 407 of a tip coordinate indication 406 of FIG. 4 indicates the current position of the conductive member 109. A setting coordinate indication 408 of the tip coordinate indication 406 indicates registered coordinates corresponding to the current position. Since the current position indicated by the current coordinate indication 407 and the registered coordinates indicated by the setting coordinate indication 408 are indicated so as to be vertically arranged side by side, determination as to whether they agree with each other can be easily made. When they substantially agree with each other, it can be determined that the conductive member 109 is normally moved.

Next, in step S10, the central processing unit 114 acquires an absorption current image (or a unit image) for each of the registered coordinates.

Finally, in step S11, the central processing unit 114 repeatedly performs the processing of steps S9 and S10 until the signal current image is acquired by the number (prescribed number) set in step S7. The flow is ended when the signal current image is acquired by the prescribed number.

Note that for the movement of the absorption current detector 110 (conductive member 109), a mechanism capable of tilting the absorption current detector 110 may be provided. When the front surface of the sample 101 is tilted, the absorption current detector 110 is also tilted so as to suit the sample 101 and a plane parallel to the front surface of the sample 101 is used as an X-Y driving surface, whereby a complicated operation requiring triaxial driving can be limited to an X-Y biaxial movement and the movement of the conductive member 109 is easily performed. In addition, a mechanism capable of rotating the conductive member 109 may be provided. Thus, in particular, the conductive member (probe for reflection electrons) 109a shown in FIG. 2C can be moved in the circumferential direction, and angular dependence in the circumferential direction can be easily observed.

(Second Embodiment)

Figure 7:
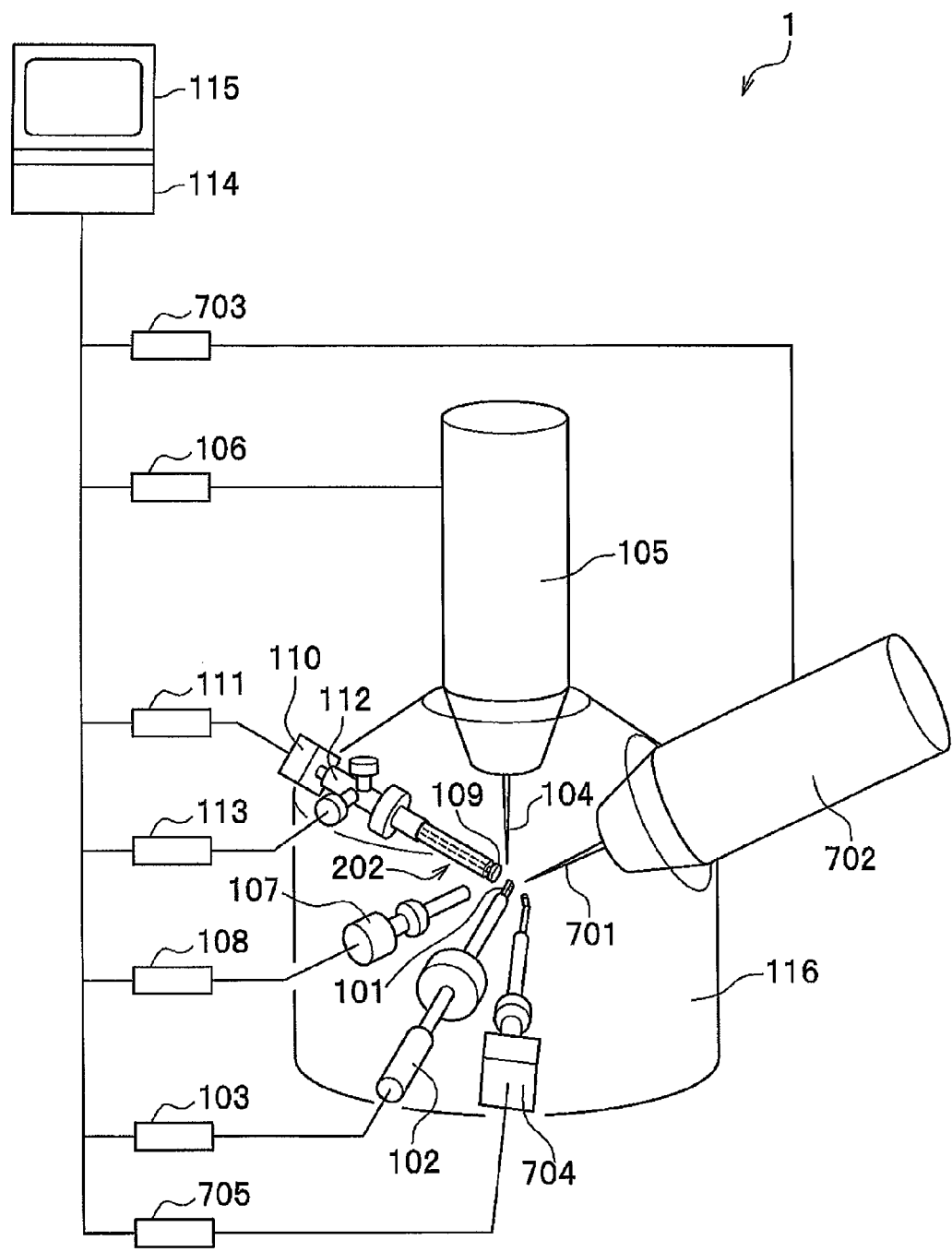
FIG. 7 shows a configuration view of the charged particle beam device according to a second embodiment of the present invention.

FIG. 7 shows a configuration view of the charged particle beam device 1 according to a second embodiment of the present invention. The second embodiment is different from the first embodiment in that it has an ion beam optical system unit (ion beam irradiation unit) 702 that irradiates the sample 101 and the conductive member 109 with an ion beam 701 and has an assist gas supply unit 704 that supplies assist gas to the sample 101 and the conductive member 109.

The ion beam optical system unit 702 and the assist gas supply unit 704 are arranged in the vacuum container 116. In addition, the charged particle beam device 1 has an ion beam optical system control unit 703 that controls the ion beam optical system unit 702 and has an assist gas supply control unit 705 that controls the assist gas supply unit 704. The ion beam optical system unit 702 can be operated by the central processing unit 114 via the ion beam optical system control unit 703. The assist gas supply unit 704 can be operated by the central processing unit 114 via the assist gas supply control unit 705.

Figure 8:
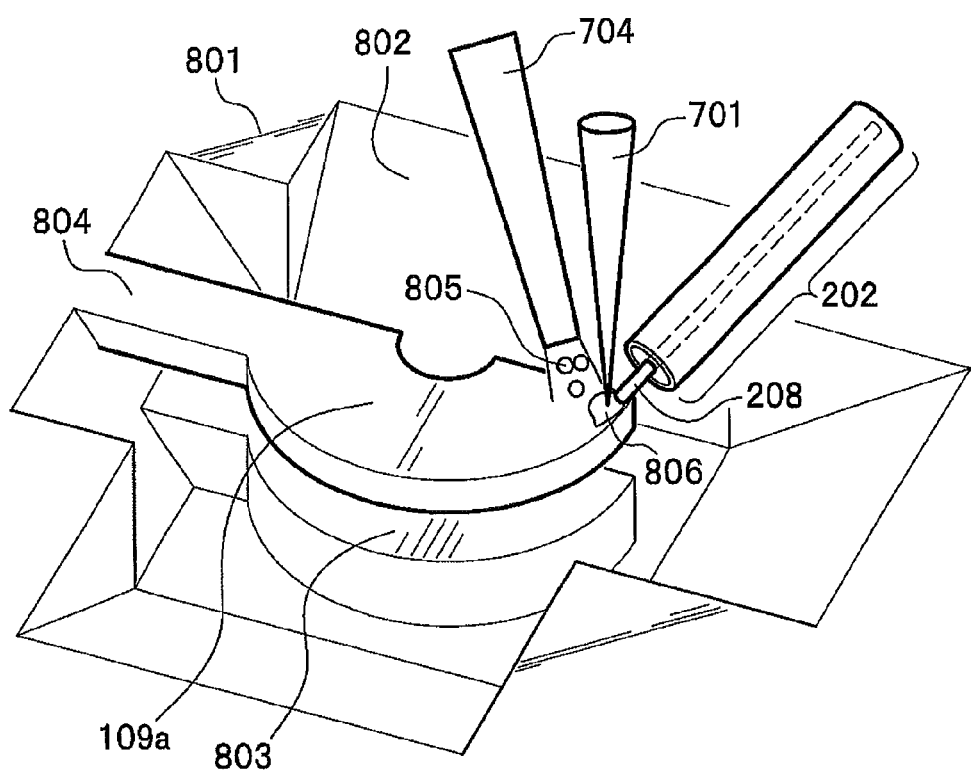
FIG. 8 is a schematic view showing a method for forming a non-contact probe in a base material with the charged particle beam device according to the second embodiment of the present invention.

FIG. 8 shows a method for forming the conductive member (probe for reflection electrons) 109a in a conductive base material 801 with the charged particle beam device 1 of the second embodiment. When the ion beam optical system unit 702 applies a great acceleration voltage to irradiate the base material 801 with the ion beam 701, the irradiated part can be etched (cut away). Therefore, first, a circumferential processing groove 802 is formed in the base material 801 by the etching described above. The circumferential processing groove 802 is formed in such a way as to leave the conductive member 109a and a support portion 804. Next, the side wall of the circumferential processing groove 802 is irradiated with the ion beam 701 to be etched. Thus, bottom-cutting processing space 803 is formed between the conductive member 109a (support portion 804) and the main body of the base material 801.

The conductive member 109a is brought into a state of floating in the air while being supported by the support portion 804. Next, the contact probe 208 is brought into contact with the conductive member 109a. When the contact part is irradiated with the ion beam 701 while the assist gas is supplied from the assist gas supply unit 704 to the conductive member 109a in a state in which the contact probe 208 is brought into contact with the conductive member 109a, an electric conductor 806 is deposited on the conductive member 109a and the contact probe 208, whereby the conductive member 109a can be connected (joined) to the tip of the contact probe 208.

Note that although the first embodiment describes the charged particle beam 104 as an electron beam, the second embodiment can use the charged particle beam 104 instead of the ion beam 701 if the charged particle beam 104 is not an electron beam but an ion beam. Further, the ion beam optical system unit 702 for the irradiation of the ion beam 701 can be omitted. Finally, the support portion 804 is irradiated with the ion beam 701 to be etched and cut away. The conductive member 109a can be extracted from the base material 801 in a state of being connected to the contact probe 208. Note that the extraction can be performed in the same way as micro sampling (TM). In addition, the sample 101 may be used as the base material 801 or may be arranged near the sample 101.

In addition, when the sample 101 and the contact probe 208 are connected to each other as shown in FIG. 2B, the part of the sample 101 with which the contact probe 208 is brought into contact is only required to be irradiated with the ion beam 701 while the assist gas is supplied to the sample 101 in a state in which the contact probe 208 is brought into contact with the sample 101. The electric conductor is deposited on the sample 101 and the contact probe 208, whereby the sample 101 and the contact probe 208 can be connected (joined) to each other.

Figure 9:
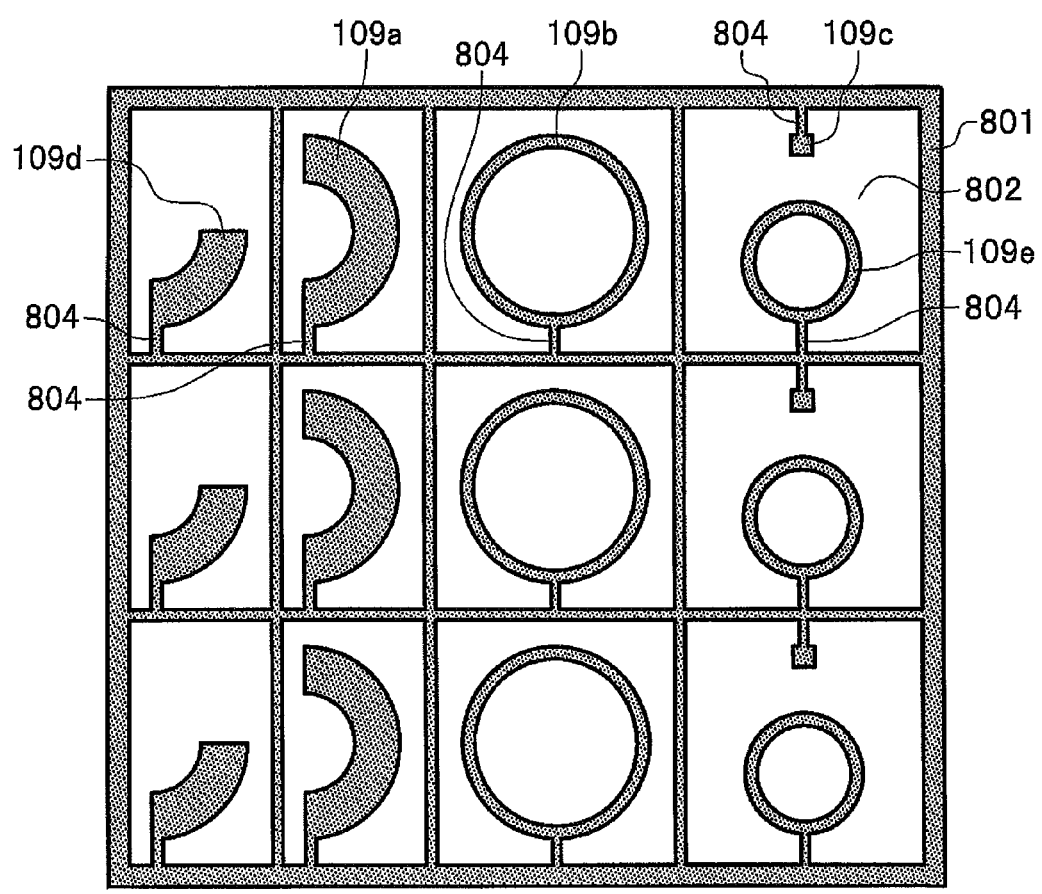
FIG. 9 is a plane view of the base material in which the plurality of non-contact probes is formed.

FIG. 9 shows a plane view of the base material 801 in which the plurality of conductive members (non-contact probes) 109(109a, 109b, 109c, 109d, and 109e) is formed. The base material 801 has the plurality of conductive members (probes for reflection electrons) 109a, conductive members (probes for transmission electrons) 109b, and conductive members (probes for a diffraction pattern) 109c supported by the support portions 804. In addition, the base material 801 has the plurality of conductive members (probes for reflection electrons) 109d supported by the support portions 804. In a planar view, the outer circumference of the conductive members 109d is formed in a quarter-circular shape (fan shape), and the inner circumference thereof is also formed in a fan shape concentric with the fan shape of the outer circumference. The conductive members 109d can observe angular dependence in the circumferential direction at higher resolution than the conductive members 109a. Further, if the central angle of the fan shape is decreased, the resolution can be increased. In addition, the base material 801 has the plurality of conductive members (probes for transmission electrons) 109e supported by the support portions 804. The outer diameter and the inner diameter of the conductive members 109e are smaller in size than those of the conductive members 109b. The conductive members 109e can be moved closer to the sample 101 than the conductive members 109b if the same secondary electrons are detected, and can detect secondary electrons of which emission amount has angular dependence different from the angular dependence of the conductive members 109b if a distance to the sample 101 is set to be the same between the conductive members 109b and 109e. By using the base material 801, the various conductive members (non-contact probes) 109(109a, 109b, 109c, 109d, and 109e) can be quickly prepared (mounted).

Note that the ion beam 701 may not be used. In this case, etching gas that performs etching with the irradiation of the electron beam 104 may be supplied, or deposition gas that is deposited with the irradiation of the electron beam 104 may be supplied.

EXPLANATION OF REFERENCES

1: charged particle beam device
101: sample
102: sample stage
103: sample position control unit
104: electron beam (charged particle beam)

105: electron beam optical system unit (charged particle beam irradiation unit)
106: electron beam optical system control unit (charged particle beam irradiation unit)
107: secondary electron detector (secondary charged particle detector)
108: secondary electron detector control unit (secondary charged particle detector)
109: conductive member (non-contact probe: absorption current detector)
109a: conductive member ((non-contact) probe for reflection (secondary) charged particles: absorption current detector)
109b: conductive member ((non-contact) probe for transmission charged particles: absorption current detector)
109c: conductive member ((non-contact) probe for diffraction pattern: absorption current detector)
110: absorption current detector main body (absorption current detector)
111: absorption current detector control unit (absorption current detector)
112: absorption current detector stage (detector moving unit: absorption current detector)
113: absorption current detector position control unit (absorption current detector)
114: central processing unit (unit image acquisition system, computer)
115: display unit
115a: GUI screen
116: vacuum container
201: secondary charged particles (angular dependence charged particles)
202: tip end of absorption current detector
203: coaxial cable
204: signal line
205: tertiary charged particles
206: insulation material
207: shield
208: contact probe
401: detector selector pull-down menu (indication)
402: detection signal (probe) selection pull-down menu (indication)
403: detector status indication
404: X-Y plane indication
405: X-Z plane indication
406: tip coordinate indication of detector
407: current coordinate indication
408: setting coordinate indication
409: detector introduction button indication
410: detector withdrawal button indication
411: detector initial setting button indication
412: sequential acquisition indication
413: sequential acquisition setting button indication
414: process number indication
415: total time indication
416: home position button indication
417: moving button indication
418: stop button indication
501: image of conductive member
502: image of sample
503: position at which conductive member is supported
504: size indication
505: scanning direction (range) indication
601: sequential acquisition setting screen
602: coordinate position setting mode
603: moving region setting mode
604: coordinate registration table indication
605: image acquisition time setting indication
606: start coordinate position setting indication
607: end coordinate position setting indication
608: pixel number setting indication
701: ion beam
702: ion beam optical system unit (ion beam irradiation unit)
703: ion beam optical system control unit (ion beam irradiation unit)
704: assist gas supply unit
705: assist gas supply control unit
801: base material
802: circumferential processing groove
803: bottom-cutting processing space
804: support portion
805: deposition gas (assist gas)
806: electric conductor (deposited material)
Ia: signal current
Ib: absorption current
θ: angle formed in direction from irradiation position of charged particle beam on sample toward emitting direction relative to incident direction
Δθ: specific angle range
R1, R2, R3: scanning region on sample satisfying angle conditions
P1, P2, P3: inspection position satisfying angle conditions
(Note 1): Claim 4 before amendment has been amended as claims 4 and 5.
(Note 2): Claim 5 before amendment has been amended as claim 9.
(Note 3): Claims 9 to 18 before amendment have been moved down.

The invention claimed is:
1. A method for operating a charged particle beam device, wherein the changed particle beam device includes a charged particle beam irradiation unit for irradiating a sample with a charged particle beam; and an absorption current detector for detecting an absorption current generated in the sample by the irradiated charged particle beam, the method comprising:
scanning, by the charged particle beam device, the sample with the charged particle beam to acquire an absorption current image, and
configuring the absorption current detector to selectively:
contact the sample and detect the absorption current flowing through the absorption current detector, or
be separated from the sample and detect an incident charged particle beam emitted from the sample by the irradiation of the charged particle beam, wherein the incident charged particle beam is incident on the absorption current detector and is detected as a signal current dependent on an angle formed in a direction from an irradiation position of the charged particle beam on the sample toward the absorption current detector relative to at least one of a normal line direction of a front surface of the sample and an incident direction of the charged particle beam.
2. The method of claim 1, wherein the absorption current detector comprises at least one of a contact probe or a non-contact probe, the method further comprising:
contacting the sample with the contact probe to cause the absorption current to flow through the contact probe; or
emitting the charged particle beam from the sample incident to the non-contact probe to cause the signal current to flow through the non-contact probe.

3. The method of claim 2, further comprising at least one of:
using the contact probe separated from the sample; or
using the non-contact probe in contact with the sample.

4. The method of claim 2, wherein the absorption current detector comprises a coaxial cable connected to at least one of the contact probe or the non-contact probe, the method further comprising:
passing at least one of the absorption current or the signal current, respectively, through a signal line of the coaxial cable, the coaxial cable including a grounded shield that covers the signal line.

5. The method of claim 3, wherein the absorption current detector comprises a coaxial cable connected to at least one of the contact probe or the non-contact probe, the method further comprising:
passing at least one of the absorption current or the signal current, respectively, through a signal line of the coaxial cable, the coaxial cable including a grounded shield that covers the signal line.

6. The method of claim 2, wherein the non-contact probe is connected to a tip of the contact probe.

7. The method of claim 6, further comprising:
supplying, by an assist as supply unit, assist gas to the sample and the absorption current detector, wherein:
the contact probe contacts a part of the sample that is irradiated with the charged particle beam while the assist gas is supplied to the sample, to deposit an electric conductor on the sample and the contact probe, and to connect the sample and the contact probe to each other, and
the tip of the contact probe contacts the non-contact probe and a part of the non-contact probe that the tip of the contact probe contacts is irradiated with the charged particle beam while the assist gas is supplied to the contact probe and the non-contact probe, to deposit an electric conductor on the non-contact probe and the tip of the contact probe, and to connect the non-contact probe and the tip of the contact probe to each other.

8. The method of claim 6, further comprising:
supplying, by an assist as supply unit, assist gas to the sample and the absorption current detector; and
irradiating, by an ion beam irradiation unit, the sample and the absorption current detector with an ion beam, wherein:
the contact probe contacts a part of the sample that is irradiated with the ion beam while the assist gas is supplied to the sample, to deposit an electric conductor on the sample and the contact probe, and to connect the sample and the contact probe to each other, and
the tip of the contact probe contacts the non-contact probe and a part of the non-contact probe that the tip of the contact probe contacts is irradiated with the ion beam while the assist gas is supplied to the contact probe and the non-contact probe, to deposit an electric conductor on the non-contact probe and the tip of the contact probe, and to connect the non-contact probe and the tip of the contact probe to each other.

9. The method of claim 2, wherein a composition of the non-contact probe contains an element having a smaller atomic number than chemical element copper.

10. The method of claim 2, wherein the non-contact probe includes at least one of:
a probe for reflection charged particles used in a case in which the charged particle beam emitted from the sample includes the reflection charged particles or secondary charged particles,
a probe for transmission charged particles used in a case in which the charged particle beam emitted from the sample includes the transmission charged particles and a plurality of tracks of the charged particle beam emitted from the sample mainly passes through a side surface of a cone, or
a probe for a diffraction pattern used in a case in which the charged particle beam emitted from the sample includes the transmission charged particles and the diffraction pattern is acquired.

11. The method of claim 10, further comprising:
alternatively connecting at least two of: the probe for the reflection charged particles, the probe for the transmission charged particles, or the probe for the diffraction pattern to the tip of the contact probe.

12. The method of claim 2, further comprising:
attaching the non-contact probe to a conductive base material; and
extracting the non-contact probe from the base material in a state of being connected to a tip of the contact probe.

13. The method of claim 12, wherein the non-contact probe is formed so that the charged particle beam irradiation unit irradiates the base material with the charged particle beam to cut away the base material.

14. The method of claim 12, wherein the non-contact probe is formed so that an ion beam irradiation unit irradiates the base material with an ion beam to cut away the base material.

15. The method of claim 1, further comprising:
detecting, by a secondary charged particle detector, secondary charged particles emitted from the sample by the irradiation of the charged particle beam; and
scanning the sample with the charged particle beam to acquire a secondary charged particle image.

16. The method of claim 15, wherein the charged particle beam device comprises a display unit having a GUI, and a computer, the method further comprising:
providing, by the computer, to the display unit, at least one of:
an indication that urges an operator to select usage of one of the absorption current detector and the secondary charged particle detector,
an indication that urges the operator to select detection of one of the absorption current and the signal current, or
an indication that urges the operator to select usage of one of a probe for reflection charged particles used in a case in which the charged particle beam emitted from the sample includes the reflection charged particles or secondary charged particles, a probe for transmission charged particles used in a case in which the charged particle beam emitted from the sample includes the transmission charged particles and a plurality of tracks of the charged particle beam emitted from the sample mainly passes through a side surface of a cone, and a probe for a diffraction pattern used in a case in which the charged particle beam emitted from the sample includes transmission charged particles and the diffraction pattern is acquired.

17. The method of claim 1, further comprising:
causing the charged particle beam to scan a region on the sample satisfying a condition that the angle substantially equals a specific angle to acquire a unit image based on the signal current;
moving the absorption current detector to a position satisfying the condition according to a movement of the region; and
combining a plurality of the unit images acquired by repeatedly performing acquisition of the unit image and movement of the absorption current detector to acquire a signal current image.

18. The method of claim 15, further comprising:
irradiating, by the charged particle beam irradiation unit, the absorption current detector and the sample with the charged particle beam,
detecting, by the secondary charged particle detector, the secondary charged particles emitted from the absorption current detector and the sample by the irradiation of the charged particle beam,
causing the charged particle beam to scan the non-contact probe and the sample to acquire the secondary charged particle image of the absorption current detector and the sample, and
setting a positional relationship between the absorption current detector and the sample based on the secondary charged particle image of the absorption current detector and the sample, such that the absorption current detector and the sample do not interfere with each other, and the angle substantially equals a specific angle.

19. The method of claim 2, further comprising:
irradiating, by the charged particle beam irradiation unit, the non-contact probe with the charged particle beam, and
causing the charged particle beam to scan the non-contact probe to acquire a shape of the non-contact probe as an absorption current image.

\* \* \* \* \*